PROCESS FOR FLATTENING ALUMINA SUBSTRATES

Filed Aug. 9, 1972

3,792,139
PROCESS FOR FLATTENING ALUMINA SUBSTRATES

Robert N. Weinstein, Granada Hills, Calif., assignor to the United States of America as represented by the Secretary of the Army Filed Aug. 9, 1972, Ser. No. 279,142
Int. Cl. C04b *41/02*
U.S. Cl. 264—58 1 Claim

ABSTRACT OF THE DISCLOSURE

A process for flattening ceramic substrates is disclosed. The process includes positioning the ceramic substrates to be flattened or contoured between high purity ground alumina plates and exerting a predetermined amount of force on the positioned ceramic substrate during an annealing cycle. The annealing cycle includes slowly heating the ceramic substrate from ambient temperature over a time interval of about 12 hours to attain a temperature of about 2580° F., maintaining the ceramic substrate at the specified temperature for about 12 hours until straightening occurs, and thereafer, slowly cooling the ceramic substrate to ambient temperature.

BACKGROUND OF THE INVENTION

The field of this invention is in the electronic field which relates to ceramic circuit boards requiring flatness for processing in standard electronic printing applications.

The prior art method used in processing circuit boards employs a grinding technique to attain the required flatness. The grinding technique results in the imparting of too smooth a surface to ensure a high quality bond for the conductive material.

A process as desired for flattening ceramic circuit boards to achieve the required flatness while retaining the ceramic boards' "as-processed" roughness.

Therefore, an object of this invention is to provide a process for flattening or otherwise forming ceramic plates to any desired final contour.

Another object of this invention is to provide a process for processing ceramic substrates to attain the required flatness for circuit board application while retaining the "as-processed" roughness of the ceramic substrate to ensure a high quality bond when further processed by a standard electronic printing application.

A further object of this invention is to provide a process for final forming operations to achieve final contouring of ceramic plates.

SUMMARY OF THE INVENTION

The process of this invention includes stacking ceramic substrates on a first plate of a high purity ground alumina, placing a second plate of a high purity ground alumina on the stacked ceramic substrates, exerting a small external force in the range of about ¼ p.s.i.g. on the second plate and the stacked ceramic substrates, and subjecting the alumina plates and stacked substrates to a programmed annealing cycle. The annealing cycle includes slowly heating from ambient temperature, the alumina plates and ceramic plates over a predetermined time interval of about 12 hours to reach a temperature of about 2580° F., maintaining the temperature of about 2580° F., until straightening of substrates has occurred, and thereafter slowly cooling the substrates for about 24 hours to ambient temperature.

DESCRIPTION OF THE PREFERRED EMBODIMENT

Figure 1:
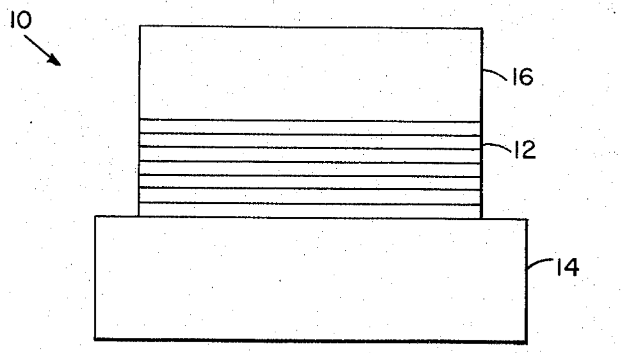
FIG. 1 is a schematic diagram of a typical setup 10 employed in this invention to achieve flattening and surface finishing of ceramic substrates.

In FIG. 1 of setup 10 are shown ceramic substrates 12 stacked on a first plate 14 of a high purity ground alumina. A second plate 16 of a high purity ground alumina is shown positioned on the ceramic substrates.

Figure 2:
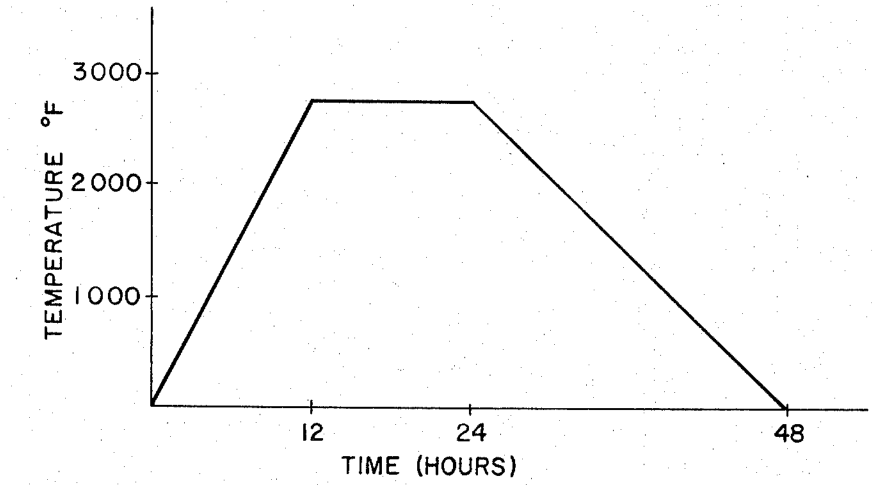
FIG. 2 is a typical time-temperature plot of the annealing cycle to which the set up of FIG. 1 is subjected to achieve flattening and surface finishing of ceramic substrates.

FIG. 2 shows a typical time-temperature plot of the annealing cycle. Both the time-temperature profile and the amount of loading of the parts during processing may be varied from those shown.

The process of this invention is conducted by stacking the ceramic substrates between high purity ground alumina plates and heating to about 2580° F. at a programmed heating rate. The plates are then held at about 2580° F. until straightening has occurred. After straightening has occurred the plates are slowly cooled. A force of about ¼ p.s.i.g. load is applied to the stacked plates during the annealing cycle.

A typical annealing cycle, which is illustrated by FIG. 2, includes slowly heating the stacked plates over a period of about 12 hours to reach the temperature of about 2580° F. which is maintained until the plates are straightened. Usually the total annealing cycle is completed in about 48 hours with about 12 hours for heating from ambient to the required temperature, about 12 hours for straightening, and about 24 hours for slowly cooling to ambient temperature.

The method of this invention is particularly preferred for solving the problems of flatness and surface finishing requirements for large (greater than 2 in.$^2$) ceramic circuit boards which employ alumina substrates (i.e. $Al_2O_3$). Alumina substrates have a high resistivity and are particularly preferred for use in electronic subsystems where high operating temperatures are a problem. When processed in accordance with the method of this invention, the alumina substrates are particularly suitable for use in high reliability circuit boards which must withstand greater heat continuously than existing boards. The boards are useful in power transformers, radio equipment, television equipment, radar, etc.

Since the method of this invention causes ceramic parts to be creep formed, another application of the method other than in circuit board straightening is for completing certain final forming operation for parts, such final forming operation as the final contouring of electromagnetic windows.

I claim:

1. A method for flattening large alumina circuit board substrates, said method comprising:
   (i) stacking the large alumina circuit board substrates to be flattened on a first plate of high purity ground alumina;
   (ii) placing a second plate of a high purity ground alumina on said stacked large alumina circuit board substrates;
   (iii) exerting a small external force in the range of about ¼ pound per square inch on said second plate; and simultaneously,
   (iv) subjecting said alumina plates and said stacked large alumina circuit board substrates to an annealing cycle while said force is being exerted, said annealing cycle comprising slowly heating said plates and said stacked large alumina circuit board substrates from ambient temperature over a predetermined time interval of about 12 hours to reach a predetermined temperature of about 2580° F., maintaining said predetermined temperature for about 12 hours until flattening of said large alumina circuit board substrates has occurred, and then slowly cooling the large alumina circuit board substrates for about 24 hours to ambient temperature to complete said annealing cycle to thereby yield said large alumina circuit board substrates.

References Cited

UNITED STATES PATENTS

| | | | |
|---|---|---|---|
| 3,442,994 | 5/1969 | Herbert | 264—57 |
| 3,632,710 | 1/1972 | Jahn | 264—332 |

OTHER REFERENCES

D. J. Shanefield et al., "The Manufacture of Fine-Grained Alumina Substrates for Thin Films," April 1971, The Engineer, Western Electric, pp. 26–31.

ROBERT F. WHITE, Primary Examiner

T. P. PAVELKO, Assistant Examiner

U.S. Cl. X.R.

264—61, 235, 332, 346